United States Patent
Kohno et al.

(10) Patent No.: US 6,768,337 B2
(45) Date of Patent: Jul. 27, 2004

(54) INTEGRATED CIRCUIT, METHOD OF CIRCUIT CONFIGURATION AND PROGRAM THEREOF

(75) Inventors: Ryuji Kohno, Tokyo (JP); Kenichiro Akai, Kanagawa (JP); Yukitoshi Sanada, Tokyo (JP); Robert Morelos-Zaragoza, Tokyo (JP); Lachlan Michael, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/223,543

(22) Filed: Aug. 19, 2002

(65) Prior Publication Data

US 2003/0080776 A1 May 1, 2003

(30) Foreign Application Priority Data

Aug. 21, 2001 (JP) ........................................ 2001-250761

(51) Int. Cl.[7] ............................................ H03K 19/177
(52) U.S. Cl. ................ 326/41; 326/40; 326/8; 380/3; 380/4; 711/103; 711/163; 713/200
(58) Field of Search ................ 326/8, 40, 41; 380/3, 4; 711/163, 103; 713/200

(56) References Cited

U.S. PATENT DOCUMENTS

| 5,467,396 | A | * | 11/1995 | Schossow et al. | ........... 713/193 |
| 5,860,099 | A | * | 1/1999 | Milios et al. | ................ 711/103 |
| 5,898,776 | A | * | 4/1999 | Apland et al. | .................. 326/8 |
| 6,304,100 | B1 | * | 10/2001 | Kobayashi | ................... 326/40 |
| 6,331,784 | B1 | * | 12/2001 | Mason et al. | ................... 326/8 |

* cited by examiner

Primary Examiner—Vibol Tan
(74) Attorney, Agent, or Firm—Frommer Lawrence & Haug LLP; William S. Frommer; Sam S. Lee (57) ABSTRACT

A plurality of circuit cells, a plurality of matrix switch sections and a plurality of switch sections for connecting between the plurality of circuit cells, all of which form a part of a circuit cell array, and a plurality of input/output cell sections arranged around the circuit cell array all change their circuit configurations in accordance with a configuration data to be supplied. In some of these circuit blocks, at least a part of the circuit thereof is fixed at a predetermined circuit configuration, and a conversion of the configuration data based on proprietary information regarding the fixed circuit is performed at a supplier of the configuration data. Thus, a differential configuration data for portions of the circuit other than the fixed circuit portion is generated and supplied to the integrated circuit.

9 Claims, 10 Drawing Sheets

INTEGRATED CIRCUIT, METHOD OF CIRCUIT CONFIGURATION AND PROGRAM THEREOF

CROSS REFERENCE TO RELATED APPLICATIONS

The present application claims priority to Japanese Priority Document JP 2001-250761, filed in the Japanese Patent Office on Aug. 21, 2001, the entire contents of which are incorporated herein by reference to the extent permitted by law.

BACKGROUND OF THE INVENTION

1. Field of the Invention

The present invention relates to an integrated circuit, the circuit configuration of which is alterable (programmable) in accordance with a supplied configuration data, a method of circuit configuration and a program thereof, and, in particular, it relates to an integrated circuit having tamper resistance against falsification and/or unauthorized use of the configuration data thereof, to a method of its circuit configuration and a program thereof.

2. Description of the Related Art

The performance of programmable logic devices, whose circuit configuration can be freely modified and altered by the user, such as FPGAs (field programmable gate array), CPLDs (complex programmable logic device) and the like has shown steady improvements over the years, and is now approaching the level of gate arrays in terms of both cost and performance.

Further, because it is possible to dynamically modify the circuit configuration of these programmable devices during system operation, they are also referred to as reconfigurable devices. A reconfigurable device allows for various applications which are otherwise unrealizable with gate arrays having fixed circuit configurations.

For example, by changing the circuit configuration into an optimal configuration depending on the operating mode of a system, multiple functions may be realized with one reconfigurable device. As a result, the degree of integration of the circuits may in effect be increased.

Further, because configuration data specifying the circuit configuration of a reconfigurable device can be delivered via a network as is done with software, various countermeasures such as fixing deficiencies in or expanding hardware functionality, and the like after products have been shipped, which had conventionally been difficult, may be performed. For example, application to portable telephones whereby they are made compatible with arbitrary communications standards according to the distributed configuration data is much anticipated.

Because the configuration data of such programmable devices are prone to being falsified or used without authorization despite the fact that they are developed at and with enormous cost and effort, there is a need for some countermeasure to be taken in order to protect such proprietary information.

As an example of a method of protecting the confidentiality of a program executed by a CPU (central processing unit), there is disclosed in U.S. Pat. No. 4,465,901 (hereinafter referred to as reference 1) a method of configuring a CMP (crypto-microprocessor) having encryption/decryption functions and a secure memory built in a conventional CPU, and internally executing the program. Because this CMP has tamper-resistance, it is not possible to look into the execution process of a program internal to the CMP from the outside. Further, because the program is stored in the secure memory in an encrypted state, and is decrypted and executed inside the CMP, proprietary information thereof is protected to an extent dictated by the level of security of the encryption scheme.

However, because decryption keys and encryption schemes in CMPs are fixed from the production stage, they cannot be arbitrarily modified afterwards. Therefore, if the decryption key information internal to a CMP gets out or is leaked, there occurs a problem in that grave damage may be brought about.

Therefore, in reference 2 titled "Prevention of illegal copying using a reconfigurable computer" by Toru Ikuma et al., CSEC 2001, 2.21, there is described a method of improving tamper resistance by making it possible to alternate between hitherto proposed digital content protection schemes, such as the CMP mentioned above, using a reconfigurable device.

However, because the circuit for loading configuration data corresponding to each content protection scheme to the reconfigurable device is fixed as a dedicated circuit having a decryption key and a decryption function, there is great risk of suffering critical damage to the system should this portion be attacked, and the decryption key and decryption function be stolen.

On the other hand, in U.S. Pat. No. 5,349,249 (hereinafter referred to as reference 3), there is disclosed a method of disposing a plurality of security protection devices for restricting readback of the programmed contents in close proximity to a plurality of programmable configuration devices that constitute a programmable device.

These security protection devices are programmable just like the configuration devices are, and, after a program is written in the configuration devices, are programmed to assume a readback prohibiting state from a readback permitting state. Then, if any one of these security protection devices is programmed to be in the readback prohibiting state, the circuit is configured so as not to allow readback of the programmed contents of the configuration devices. As a result, leakage of programmed contents of the configuration devices is prevented.

For example, if the configuration devices and security protection devices mentioned above are configured on an EPROM (erasable and programmable read only memory), in which the program can be erased with ultraviolet rays, even if the security protection devices are located through reverse-engineering, because programs in the adjoining configuration devices are simultaneously erased when programs in these security protection devices are erased, obtaining useful information regarding the circuit configuration becomes difficult. According to reference 3, in a case where four security bits are included in a configuration device array of 9 bit rows by 48 bit columns, if these four security bits are erased, 32 to 80 of the 432 configuration bits are erased at the same time. With such a large amount of information constituting a logic circuit missing, reverse engineering becomes extremely difficult.

SUMMARY OF THE INVENTION

All of the related art disclosed in the respective references described above, however, are directed to the prevention of leakage of information already written in the devices, and do not disclose protection of the confidentiality of information prior to being written. In other words, if such information is always to be written in the device by the manufacturer prior to shipment of the product, the related art mentioned above for improving the tamper-resistance of the device itself is sufficient. However, for a reconfigurable device, whose configuration data is distributed via some route, such as the internet or a LAN for example, to which a reverse engineer can easily gain access and see the data contents, the related art described above cannot protect the confidentiality of the configuration data.

Therefore, the present invention provides an integrated circuit, the circuit configuration of which is reconfigurable in accordance with a configuration data to be supplied, for protecting the confidentiality of the configuration data to be supplied. The present invention also provides a method of circuit configuration thereof. Further, the present invention provides a program for a data processing apparatus for generating the configuration data for the integrated circuit.

An integrated circuit according to a first aspect of the present invention comprises a plurality of circuit blocks whose circuit configuration can be reconfigured in accordance with configuration data to be supplied, wherein the plurality of circuit blocks mentioned above include several types of circuit blocks each of which configures its circuit in accordance with the supplied configuration data based on a predetermined rule which differs for each of the circuit blocks.

Further, the several types of circuit blocks described above may include a first type of circuit block which alters its circuit configuration in accordance with the supplied configuration data, and a second type of circuit block which has a fixed and predetermined circuit configuration and about which the alteration of the circuit configuration in accordance with the configuration data mentioned above is not possible.

According to the integrated circuit of the first aspect of the present invention, the plurality of circuit blocks mentioned above include the several types of circuit blocks, in which circuits corresponding to the configuration data mentioned above are configured based on predetermined rules which differ for each of the several types of circuit blocks. For example, there are included the first type of circuit block which alters its circuit configuration in accordance with the supplied configuration data mentioned above, and the second type of circuit block having a fixed and predetermined circuit configuration, about which the alteration of the circuit configuration in accordance with the configuration data mentioned above is impossible. In each of the circuit blocks mentioned above, a circuit corresponding to the supplied configuration data is configured based on a circuit configuration rule corresponding to the circuit block type thereof.

Further, there may be provided a configuration alteration (reconfiguration) prohibiting circuit for determining whether or not a bit data of a predetermined value is inserted in a predetermined bit in the supplied configuration data mentioned above, and prohibiting alteration of the circuit configuration of the circuit block mentioned above in accordance with the determination thereof.

A method of circuit configuration according to a second aspect of the present invention is a method of circuit configuration for an integrated circuit having a plurality of circuit blocks whose circuit configuration is alterable in accordance with configuration data to be supplied, the method comprising the steps of: generating the configuration data mentioned above in accordance with information regarding a circuit to be configured in the integrated circuit mentioned above; converting the generated configuration data above in accordance with information on a circuit configuration rule which differs for each of several types of circuit blocks included in the plurality of circuit blocks mentioned above; supplying the converted configuration data above to the integrated circuit mentioned above; and configuring circuits corresponding to the supplied configuration data above in the circuit blocks mentioned above based on the circuit configuration rules corresponding to the respective circuit block types.

In the method of circuit configuration according to the second aspect of the present invention, the configuration data mentioned above is generated in accordance with information regarding the circuit above to be configured in the integrated circuit. The configuration data thus generated is converted in accordance with information regarding the circuit configuration rule which differs for each of the several types of circuit blocks included in the plurality of circuit blocks mentioned above. The configuration data thus converted is supplied to the integrated circuit mentioned above, upon which a circuit corresponding to the supplied configuration data is configured in the circuit blocks based on the circuit configuration rules mentioned above corresponding to the respective circuit block types.

Further, in generating the configuration data as mentioned above, a configuration data specifying the circuit configuration of a first type of circuit block whose circuit configuration is alterable and the connection between the first type of circuit block mentioned above and a second type of circuit block having a fixed circuit configuration may be generated. In configuring the circuit as mentioned above, depending on the configuration data mentioned above, the first type of circuit block may be configured while at the same time, the first type of circuit block may be connected with the second type of circuit block.

Still further, in converting the configuration data as mentioned above, a bit data of a predetermined value may be inserted in a predetermined bit in the configuration data generated above corresponding to predetermined information for lifting a circuit configuration alteration (reconfiguration) prohibition of the circuit blocks. In configuring the circuit as mentioned above, it may be determined whether or not the bit data of the predetermined value is inserted in the predetermined bit in the configuration data, and alteration of the circuit configuration of the circuit blocks mentioned above may be prohibited depending on the resulting determination.

A program according to a third aspect of the present invention is a program for a data processing apparatus for generating a configuration data for an integrated circuit having a plurality of circuit blocks whose circuit configuration is alterable in accordance with the supplied configuration data, wherein the program comprises the steps of: generating the configuration data in accordance with the information on the circuit to be configured in the integrated circuit; and converting the configuration data generated above in accordance with information regarding a circuit configuration rule which differs for each of the several types of circuit blocks included in the plurality of circuit blocks mentioned above.

Further, in generating the configuration data described above, the configuration data may be generated in accordance with the circuit information as well as the configuration rule information, and may specify the circuit configuration of the first type of circuit block whose circuit configuration is alterable, and the connection between the first type of circuit block and the second type of circuit block having a fixed circuit configuration.

Still further, in converting the configuration data mentioned above, a bit data of a predetermined value may be inserted in a predetermined bit of the configuration data in accordance with predetermined information prohibiting alteration of the circuit configuration of the circuit block.

BRIEF DESCRIPTION OF THE DRAWINGS

The above and other aspects, features and advantages of the present invention will become more apparent from the following description of the presently preferred exemplary embodiments of the present invention taken in conjunction with the accompanying drawings, in which.

DETAILED DESCRIPTION OF THE PREFERRED EMBODIMENTS

<First Embodiment>

Figure 1:
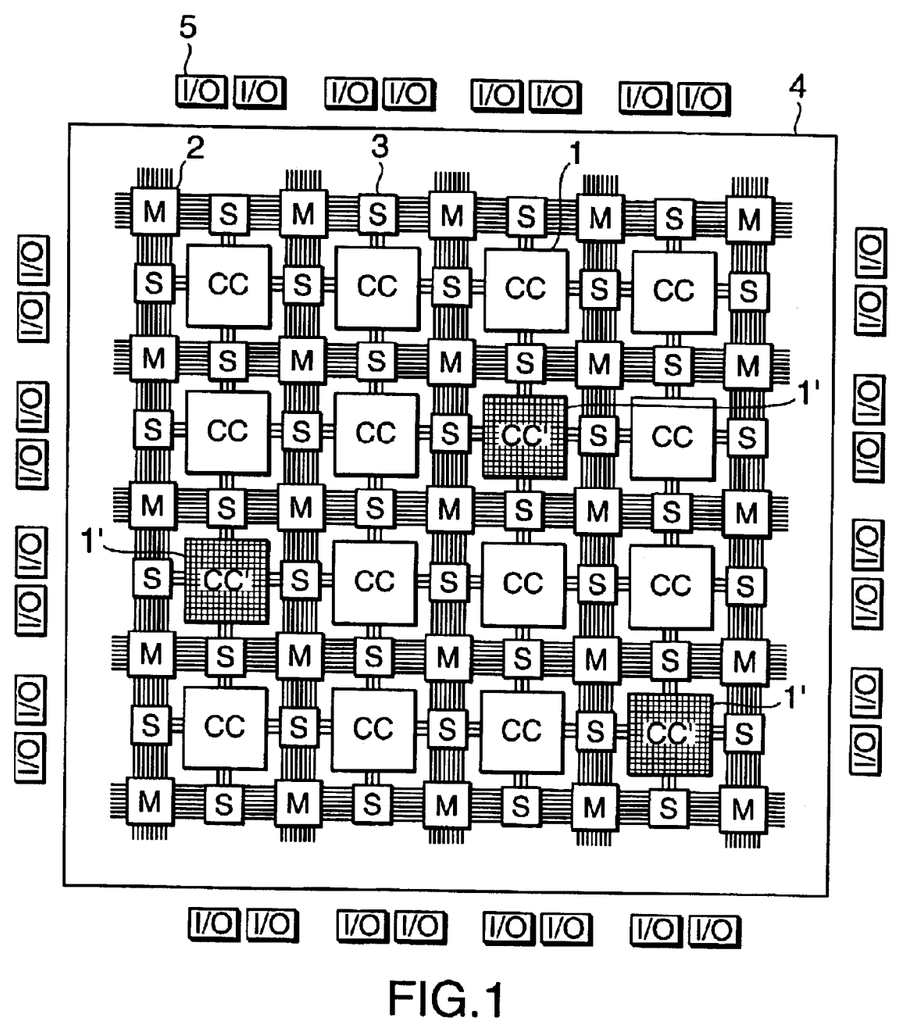
FIG. 1 is a schematic block diagram illustrating an integrated circuit according to one embodiment of the present invention.

A first embodiment of the present invention will be described below with reference to the accompanying drawings. FIG. 1 is a schematic block diagram illustrating an integrated circuit according to the first embodiment of the present invention.

In FIG. 1, there are shown circuit cells 1 and 1', matrix sections 2, switch sections 3, a circuit cell array 4 in which the circuit cells 1 are arranged in a matrix, and input/output cells 5.

The circuit cells 1 and 1' are blocks which configure circuits in accordance with configuration data to be supplied and based on predetermined rules that vary from block to block. For example, whereas the circuit configuration of the circuit cell 1 is alterable in accordance with configuration data, in the circuit cell 1', at least a portion of the circuit of the circuit cell 1 is fixed at a predetermined circuit configuration. Therefore, even if the same configuration data is supplied to these circuit cells, they would ordinarily end up with different circuit configurations.

As shown in FIG. 1, some of the circuit cells 1 arranged in a matrix are randomly replaced with such circuit cells 1' such that it cannot be known by a reverse engineer which of the circuit cells is fixed at what sort of a circuit.

The circuit configuration rules corresponding to the configuration data may be set in a number of ways other than the method of fixing the circuit mentioned above. For example, instead of fixing a portion or the whole of the circuit of the circuit cell 1' as described above, several types of circuit cells which, in response to configuration data of an identical value, configure circuits that are distinct from the circuit cell 1 may be provided randomly. Further, the required number of bits in the configuration data for specifying the circuit configuration may be set to be different for each type of circuit cell. Information on the circuit configuration rule for each circuit cell is kept unknown to a reverse engineer.

Figure 2:
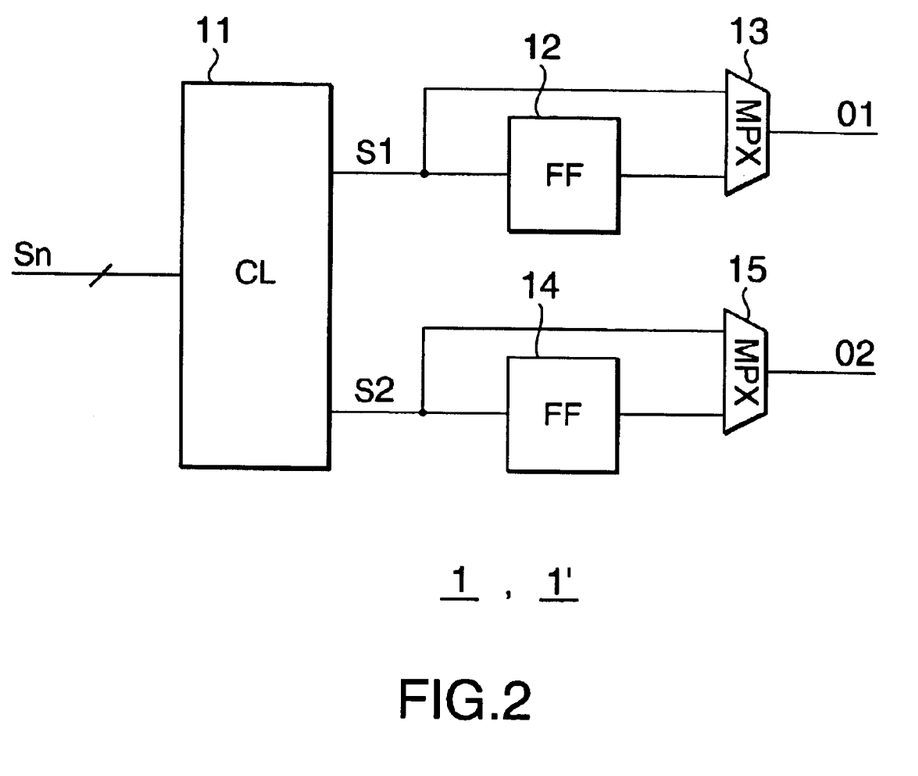
FIG. 2 is a schematic block diagram illustrating an example of the circuit cell shown in FIG. 1.

An example of the internal configurations of the circuit cells 1 and 1' will now be described. FIG. 2 is a schematic block diagram illustrating one example of the circuit cells of FIG. 1.

In FIG. 2, there are shown a combinational circuit 11, flip-flops 12 and 14 and multi-plexers 13 and 15. The combinational circuit 11 outputs a unique 2 bit signal (signals S1 and S2) in accordance with an input signal Sn of n bits (n denotes a natural number). However, the combination of signals S1 and S2 corresponding to the input signal Sn is arbitrarily programmed in accordance with the configuration data. The combinational circuit 11 comprises, for example, an SRAM or the like in which stored data is rewritable in accordance with the configuration data.

The flip-flop 12 receives the signal S1 from the combinational circuit 11, holds the signal in sync with a clock signal (not shown), and outputs the held signal to the multi-plexer 13.

Similarly, the flip-flop 14 receives the signal S2 from the combinational circuit 11, holds the signal in sync with a clock signal (not shown), and outputs the held signal to the multi-plexer 15.

The multi-plexer 13 selects either the signal S1 from the combinational circuit 11 or the signal held by the flip-flop 12, and outputs it as an output signal O1. Similarly, the multi-plexer 15 selects either the signal S2 from the combinational circuit 11 or the signal held by the flip-flop 14, and outputs it as an output signal O2. Which signal is selected by the multiplexers 13 and 15 is arbitrarily programmed in accordance with the configuration data.

In the circuit cell having the configuration mentioned above, the signals S1 and S2 which uniquely correspond to the input signal Sn of n bits are generated in the combinational circuit 11, and are each held in the flip-flop 12 or the flip-flop 14, respectively. Then, either the output signals from the combinational circuit 11 or the signals held in the respective flip-flop circuits are selected by the multi-plexers 13 and 15, and are then outputted.

Further, in the circuit cell 1' having a fixed circuit, the circuitry of at least one of the combinational circuit 11, the multi-plexer 13 and the multi-plexer 15, which are programmable, is fixed, for example, physically or electrically. Still further, in a case where the several types of circuit cells, which configure circuits in accordance with mutually distinct rules with respect to a configuration data of an identical value, are provided, at least a portion of these programmable circuits described above is configured to have a physically or electrically different configuration depending on the type of the circuit cell.

The matrix switch sections 2 shown in FIG. 1 are blocks in which switches for connecting wirings LV running in the vertical direction and wirings LH running in the horizontal direction are assembled in a matrix at the intersections between the wirings LV and the wirings LH. The connections by means of these switches are programmed in accordance with the configuration data.

The switch sections 3 are blocks in which switches for connecting input/output wirings for the circuit cell 1 and the vertical wirings LV or the horizontal wirings LH are assembled. The connections by means of these switches are also programmed in accordance with the configuration data.

As was the case in the circuit cell 1', some of the switches in the matrix switch sections 2 and/or the switch sections 3 may be fixed. Further, instead of fixing the connections as described above, there may be provided several types of switches in the matrix switch sections 2 and/or switch sections 3 for establishing connections in accordance with mutually distinct rules with respect to a configuration data of an identical value.

Figure 3:
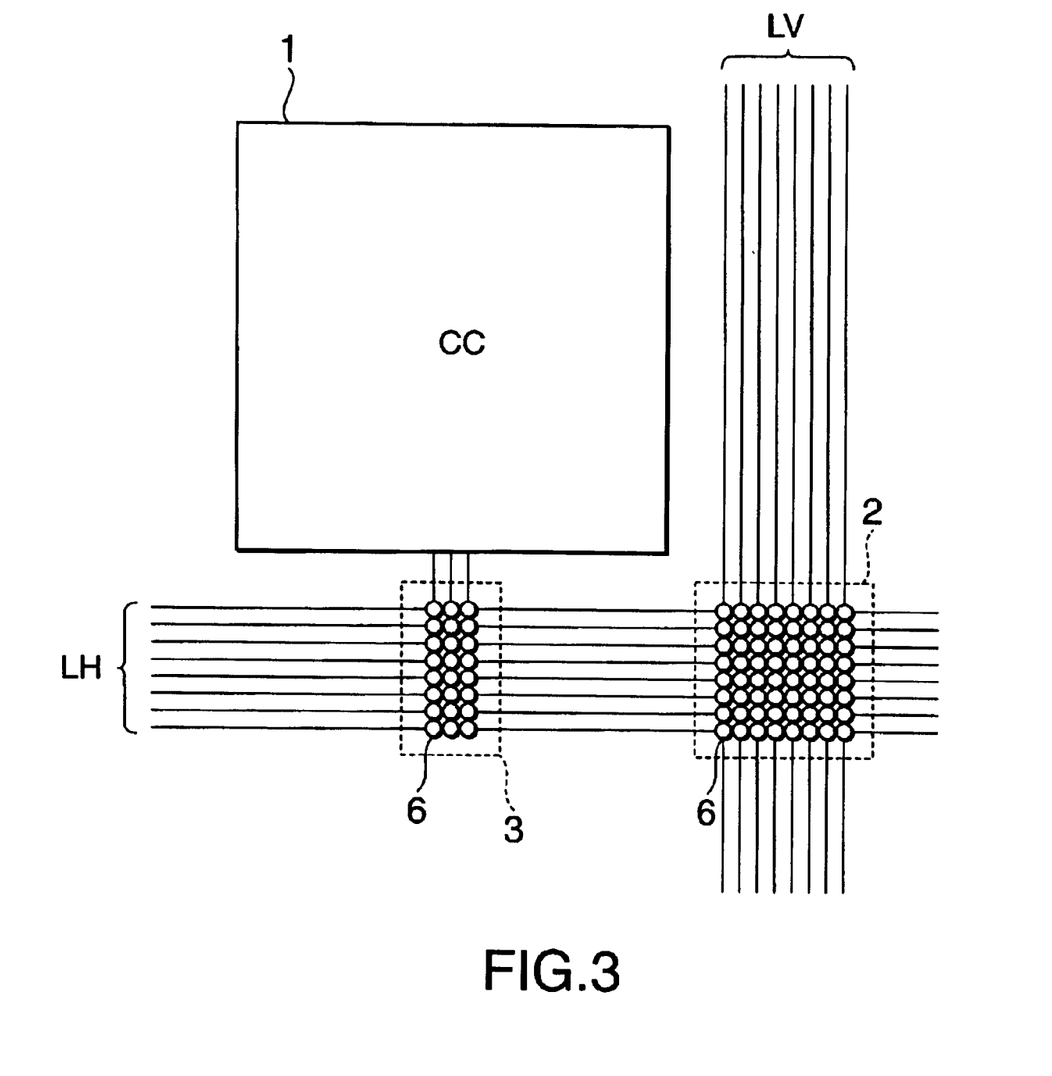
FIG. 3 is a diagram illustrating the switch section and the matrix switch section shown in FIG. 1.

FIG. 3 is an enlarged view of the switch section 3 and the matrix switch section 2 of FIG. 1.

In the matrix switch section 2, sixty-four switches 6 are disposed at the intersections between eight vertical wirings LV and eight horizontal wirings LH. In the switch section 3, twenty-four switches 6 are disposed at the intersections between three input/output wirings vertically extending from the circuit cell 1 and the eight horizontal wirings LV. Likewise, although not shown in FIG. 3, twenty-four switches 6 are also disposed at the intersections between three input/output wirings extending horizontally from the circuit cell 1 and the eight vertical wirings LH.

Figure 4:
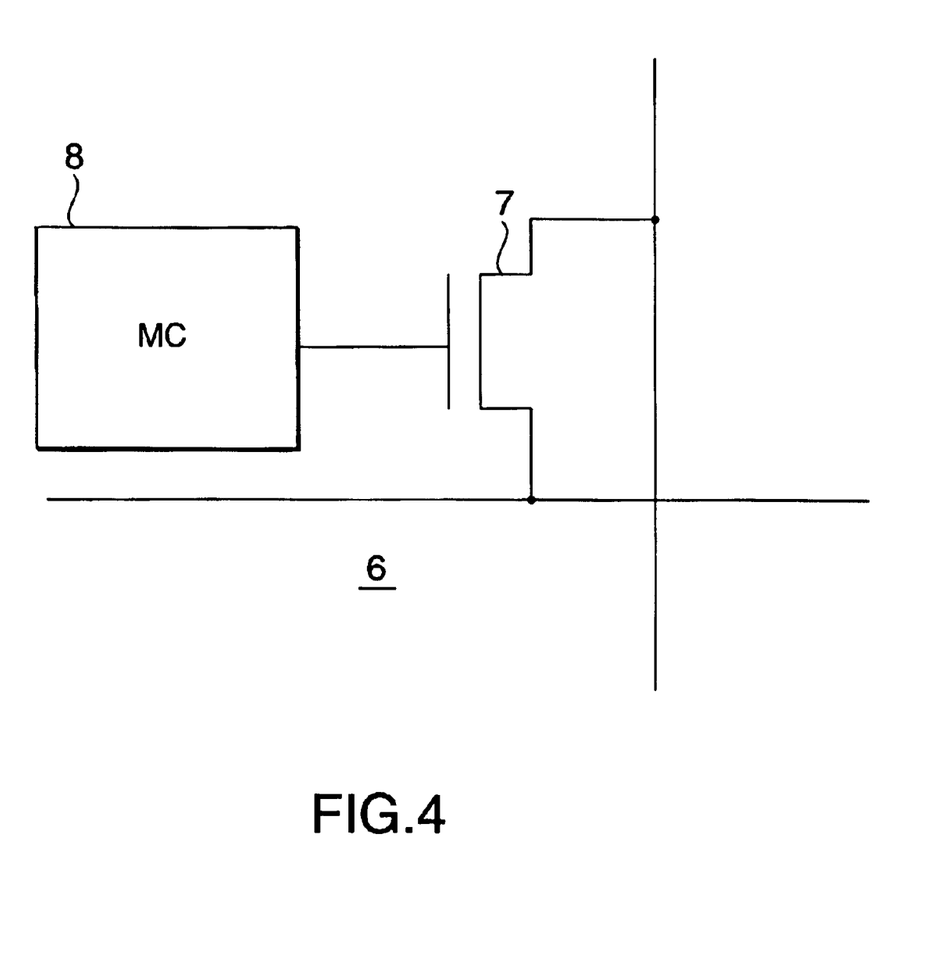
FIG. 4 is a schematic circuit diagram illustrating an example of the switches shown in FIG. 3.

FIG. 4 is a schematic circuit diagram showing an example of the switches 6 shown in FIG. 3. In FIG. 4, there are shown a transistor 7 and a memory cell 8, such as an SRAM.

The connection status between the vertical wiring LV and the horizontal wiring LH is set by the switch 6 by having the transistor 7 be set in either a conducting or non-conducting state in accordance with a value of a data of one bit held in the memory cell (MC) 8. In the memory cell 8 in each of the switches 6 is held a bit data of a value corresponding to the configuration data.

The input/output (I/O) cells 5 shown in FIG. 1 are blocks for inputting/outputting signals from the circuit cell array 4, and for inputting/outputting signals between the input/output pins of the encasing in which the integrated circuit is housed, and the circuit configuration of the input/output cells 5 is programmable in accordance with the configuration data, much like the circuit cells 1.

Also, it may be arranged for some of these I/O cells 5 to have a fixed circuit configuration much like the circuit cells 1'.

Further, instead of fixing the circuit configuration, there may be provided several types of I/O cells 5 which, with respect to the configuration data of an identical value, configure circuits based on mutually differing rules.

Figure 5:
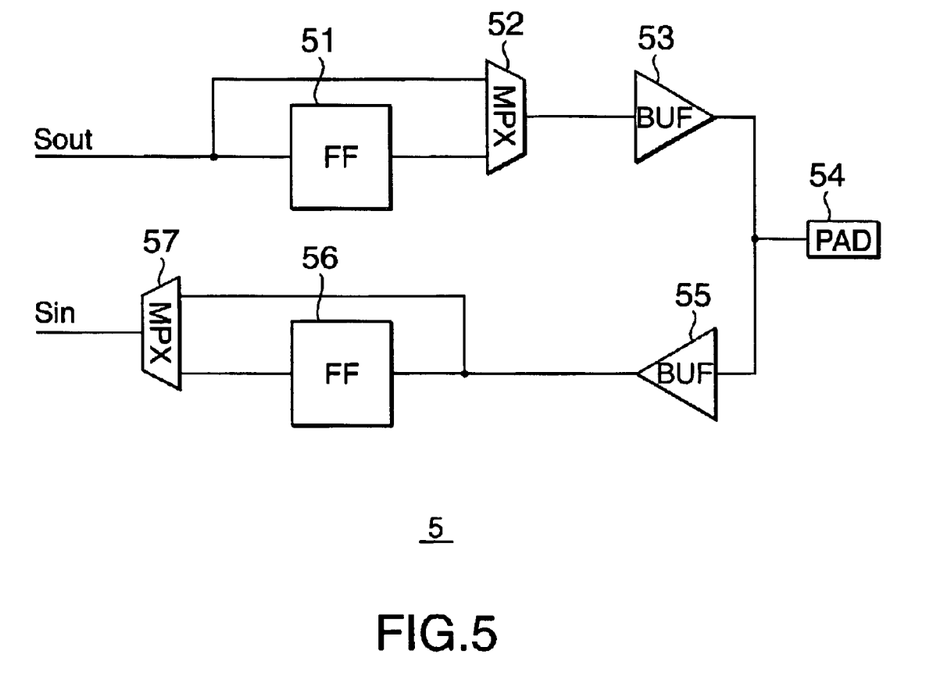
FIG. 5 is a schematic block diagram illustrating an example of the input/output cells shown in FIG. 1.

FIG. 5 is a schematic block diagram illustrating an example of the I/O cells 5 shown in FIG. 1.

In FIG. 5, there are shown flip-flops 51 and 56, multi-plexers 52 and 57, buffers 53 and 55 and an input/output pad 54.

The flip-flop 51 holds an output signal $S_{out}$ from the circuit cell array 4 in sync with a clock signal (not shown), and also outputs the held signal to the multi-plexer 52.

The multi-plexer 52 selects either the output signal $S_{out}$ from the circuit cell array 4 or the signal from the flip-flop 51, and outputs it to the buffer 53. Which output is selected by the multi-plexer 52 is programmed in accordance with the configuration data.

The buffer 53 converts the level of the output signal outputted from the multi-plexer 52, and outputs it to the input/output pad 54.

The input/output pad 54 is a terminal which is electrically connected to the input/output pins housed in the encasing for the integrated circuit.

The buffer 55 converts the level of a signal inputted from the input/output pad 54, and outputs it to the flip-flop 56 and the multi-plexer 57.

The flip-flop 56 holds the signal from the buffer 55 in sync with a clock signal (not shown), and outputs the held signal to the multi-plexer 57.

The multi-plexer 57 selects either the signal from the buffer 55 or the signal from the flip-flop 56, and outputs it to the circuit cell array 4. Which output is selected is programmed in accordance with the configuration data.

With the input/output block 5 having the configuration described above, the signal $S_{out}$ outputted from the circuit cell array 4 is either outputted as it is via the buffer 53 to the input/output pad 54 or is outputted to the input/output pad 54 via the buffer 53 after being held in the flip-flop 51. Which signal is to be outputted is programmed in accordance with the configuration data.

Likewise, a signal inputted from the input/output pad 54 is either outputted as it is via the buffer 55 to the circuit cell array 4 or is outputted to the circuit cell array 4 after being held in the flip-flop 56. Which of these signals is to be outputted is programmed in accordance with the configuration data.

Next, procedures for getting the integrated circuit of FIG. 1 having the configuration described above to configure circuits are described with reference to FIGS. 6 and 7.

Figure 6:
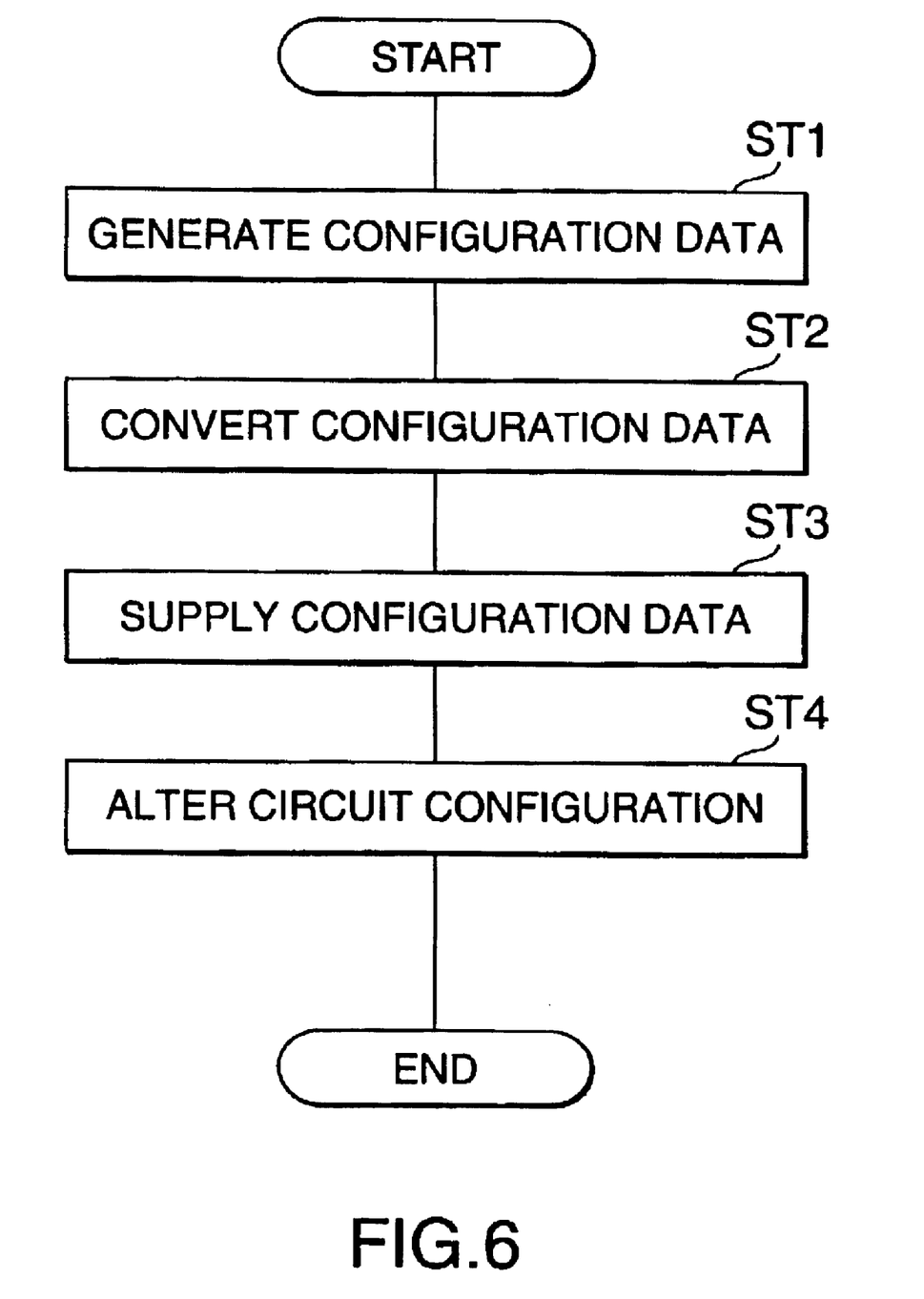
FIG. 6 is a flowchart indicating an example of a circuit configuration process for the integrated circuit of FIG. 1.

FIG. 6 is a flowchart illustrating an example of circuit configuration procedures (steps) for the integrated circuit of FIG. 1.

Figure 7:
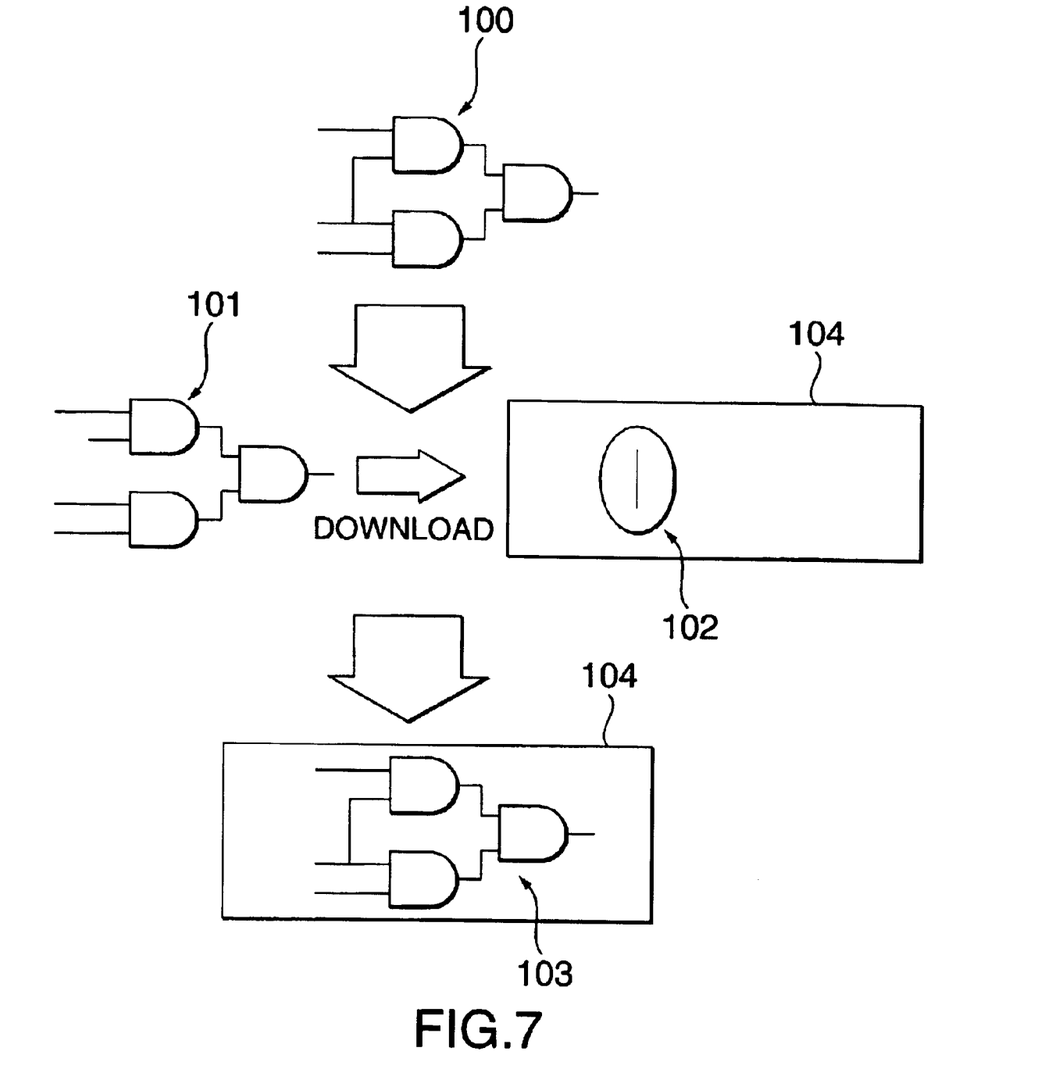
FIG. 7 is a diagram illustrating the circuit configuration process shown in FIG. 6.

FIG. 7 is a schematic diagram illustrating these circuit configuration procedures.

Referring to FIG. 7, there are shown a configuration data 100 generated on the basis of a designed circuit data, a configuration data 101 converted on the basis of proprietary information of a target integrated circuit, proprietary information 102 of the target integrated circuit, a configuration data 103 written to the target integrated circuit, all of which are indicated using circuit symbols. Further, there is also shown a program section 104 having a programmable circuit block, such as the circuit cells 1, the input/output cells 5, the matrix switch sections 2, the switch sections 3 and the like.

Step ST1:

Circuit data of the integrated circuit designed in the format of a circuit diagram, hardware description language or the like, and completed through various inspection procedures such as timing simulation, an electrical consistency check and the like, is allotted to each of the circuit blocks of the target integrated circuit (for example, the circuit cells 1, the input/output cells 5, the matrix switch sections 2, and the switch sections 3), and at the same time, a processing step for determining the specific layout and wiring for the target integrated circuit is executed. Thus, the configuration data 100 of a predetermined format is generated.

In the case where a fixed circuit which is not reconfigurable in accordance with the configuration data is to be provided in each of the programmable circuit blocks, the assignment of circuit data, layout and wiring are performed based on the proprietary information 102 regarding this fixed circuit, and the configuration data 100 is thus generated. The configuration data 100 thus generated contains data which specifies the circuit configuration for the programmable section(s) of the integrated circuit and data which specifies the connection between this/these programmable section(s) and the fixed circuit(s). The proprietary information 102 regarding the fixed circuit(s) is kept unknown to a reverse engineer.

Step ST2:

Next, the configuration data 100 generated in step ST1 is converted into a configuration data 101 based on the proprietary information 102 of the circuit configuration rule defined for each circuit block included in the target integrated circuit. This proprietary information 102 of the circuit configuration rule may be, for example, information regarding the fixed circuit described above, or it may simply be information which specifies for each block the correspondence between the value of the configuration data and the circuit to be configured. The proprietary information 102 of the circuit configuration rule used in this step is kept unknown to a reverse engineer.

Step ST3:

Next, the configuration data 101 converted in step ST2 is supplied to the target integrated circuit. It may be supplied, for example, via a network, such as the internet or LAN, or by means of a storage medium, such as a CR-ROM or the like. Alternatively, the configuration data 101 may already be written to a ROM or the like provided on the same board as the integrated circuit, and may be supplied therefrom as well. The configuration data 101 may also be supplied to the integrated circuit using various other methods.

In this step, if the configuration data 101 to be supplied to the integrated circuit is converted with the proprietary information 102 regarding the fixed circuit described above, it may be considered that the configuration data 101 is the differential value in which the proprietary information 102 regarding the fixed circuit is taken away from the original configuration data 100 generated in step ST1. Therefore, in order for a reverse engineer to be able to restore the original configuration data 100 from this differential configuration data 101, he/she needs to analyze the fixed circuit formed in the integrated circuit.

On the other hand, because the confidentiality of the information internally recorded in the integrated circuit can easily be enhanced using conventional technologies, it is extremely difficult to obtain the proprietary information 102 regarding the fixed circuit. For example, a method of obtaining the security information 102 by generating some arbitrary configuration data, loading it to the integrated circuit and studying the circuit operation from the signal status of the input/output pins may be considered, however, because the number of configuration data to be generated increases as the scale of the integrated circuit becomes larger, and further, because the possible combinations between the signals to be inputted to the integrated circuit in which circuits are configured based on this configuration data increase, the amount of information to be analyzed becomes enormous. Therefore, a huge cost would be required to carry out this method of analysis, thereby making it extremely difficult to restore the circuit information from the configuration data 101.

Further, in the case where, instead of having the fixed circuit portion, there are provided the plurality of types of circuit blocks which configure the circuits in accordance with mutually differing rules with respect to the configuration data of an identical value, because there exists no omitted portion in the configuration data to be converted in step ST2 in comparison with the configuration data generated in step ST1, in principle it is not impossible to restore the information of the circuit from the configuration data itself. However, in practice, because it is necessary to somehow obtain from the integrated circuit the information on the circuit rule determined for each circuit block, it would be extremely difficult, as in the case where fixed circuits are included, to restore the information regarding the circuit from the configuration data once it is converted.

Step ST4:

In relation to the configuration data 101 supplied to the integrated circuit in step ST3, the circuits in each circuit block are configured based on the respective circuit configuration rules. For example, in the case where a secure fixed circuit is contained in the circuit blocks of the integrated circuit, the circuits in the other programmable circuit blocks are configured in accordance with the configuration data, while at the same time the secure fixed circuit and the programmable circuit block are connected in accordance with the configuration data. As a result, the intended circuit is configured on the integrated circuit.

As described hereinabove, in the integrated circuit according to the first embodiment described above, circuits are configured in accordance with the configuration data based on the circuit configuration rules which differ for each of the several types of circuit blocks included in the integrated circuit. The configuration data is converted in accordance with the information on these circuit configuration rules, and is supplied to the target integrated circuit. For example, in the case where there are contained circuit blocks which are programmable in accordance with the configuration data and circuit blocks which are fixed in advance at a predetermined circuit configuration, the configuration data is converted in accordance with the proprietary information regarding these fixed circuit blocks, and is then supplied to the target integrated circuit. Therefore, even if the contents of this configuration data were viewed by a reverse engineer, because it is extremely difficult to restore therefrom the information on the original circuit, the configuration data can be supplied safely to the integrated circuit in a state in which the confidentiality of the configuration data is protected.

<Second Embodiment>

A second embodiment of the present invention will now be described below.

Generally, in order for a reverse engineer to be able to restore the information regarding the circuit from the configuration data, he/she must check the circuit operation by writing configuration data to the integrated circuit. Therefore, with respect to the second embodiment of the present invention described below, an integrated circuit which is capable of further improving tamper resistance by placing restrictions on the writing of the configuration data to the integrated circuit is disclosed.

Figure 8:
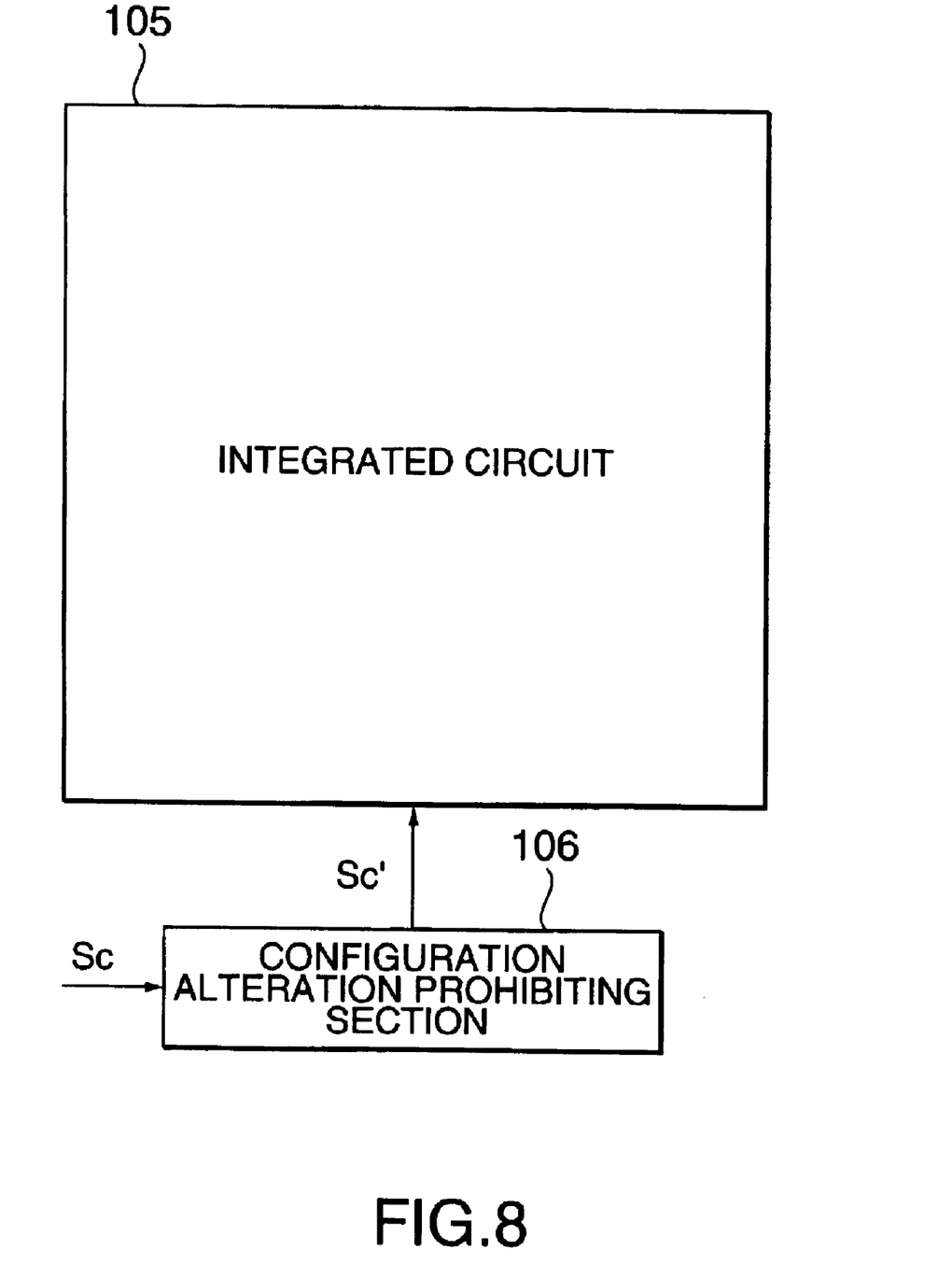
FIG. 8 is a schematic block diagram illustrating an example of an integrated circuit which is provided with a circuit configuration alteration (reconfiguration) prohibiting section.

FIG. 8 is a schematic block diagram illustrating one example of an integrated circuit which is provided with a circuit configuration alteration prohibiting section is shown.

In FIG. 8, there are disclosed an integrated circuit 105 and a circuit configuration alteration prohibiting section 106.

This integrated circuit 105 is the integrated circuit according to the first embodiment of the present invention having, for example, the circuit cells 1, the input/output cells 5, the matrix switch sections 2, the switch sections 3 and the like. In accordance with configuration data Sc supplied from the configuration alteration prohibiting section 106, the circuit configuration of the integrated circuit 105 is altered.

The circuit configuration alteration prohibiting section 106 is a block for prohibiting alteration of the circuit configuration of the integrated circuit 105 in accordance with the configuration data Sc. For example, it is determined whether or not a security bit of a predetermined value is inserted in a predetermined bit in the configuration data Sc, and depending on the result of this determination, alteration of the circuit configuration of the programmable circuit blocks in the integrated circuit 105 is or is not prohibited.

In this case, it may also be arranged such that the security bit data which is inserted at the supplier of the original configuration data is erased at the configuration alteration prohibiting section 106, and a remaining configuration data Sc' is supplied to the integrated circuit 105.

Procedures for configuring a circuit in the integrated circuit having the configuration mentioned above will be described below with reference to the flowchart of FIG. 9.

Figure 9:
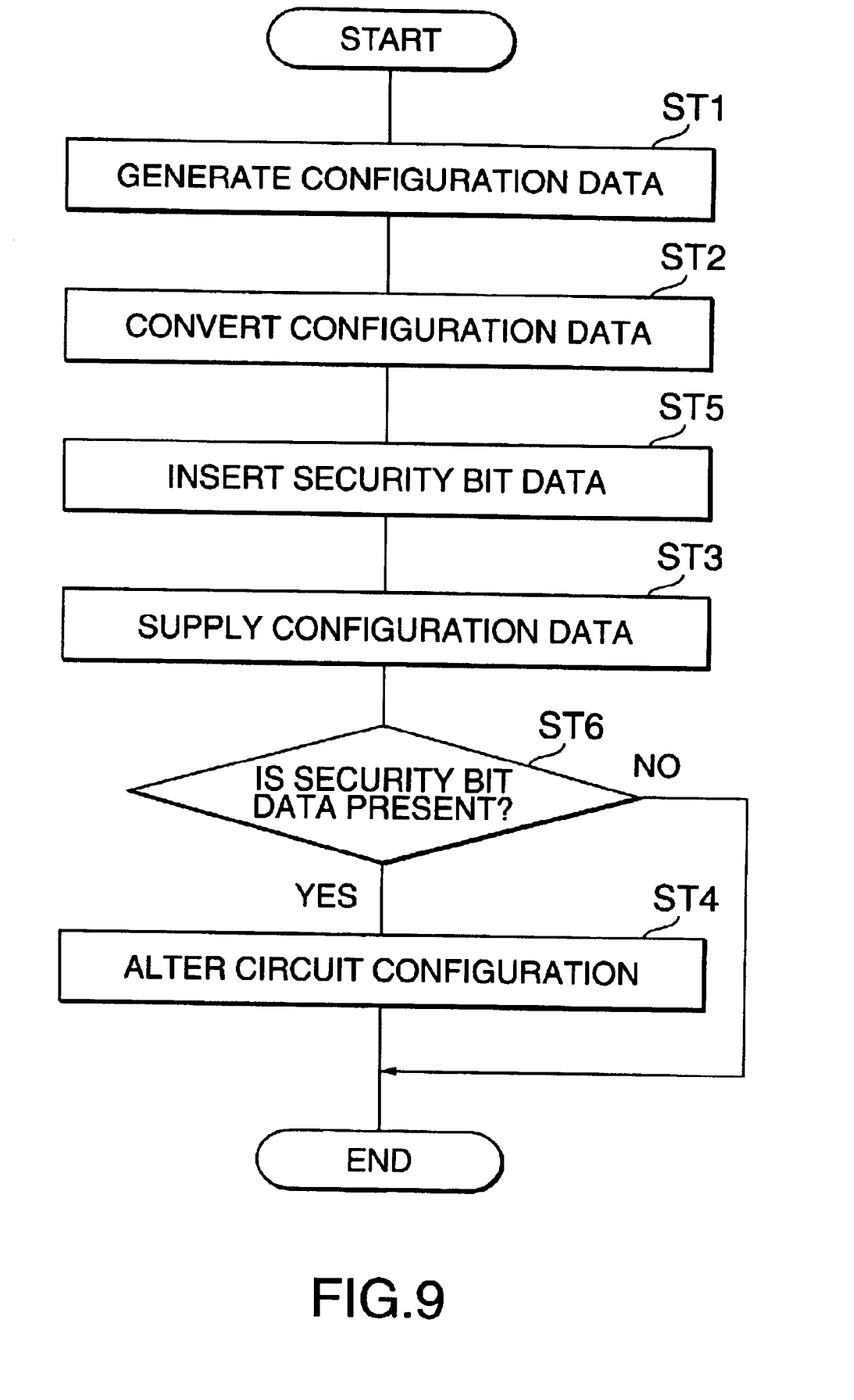
FIG. 9 is a flowchart illustrating an example of a circuit configuration process for the integrated circuit of FIG. 8.

This flowchart illustrates an example of the procedures for configuring a circuit in the integrated circuit of FIG. 8, and steps for performing processings similar to those of FIG. 6 are designated by like reference numerals in FIG. 9.

As indicated in FIG. 9, after the conversion of the configuration data in step ST2, a process for inserting a predetermined security bit data in the configuration data is executed in step ST5. Then, once the configuration data Sc in which the security bit is inserted is supplied to the configuration alteration prohibiting section 106 in step ST3, in the following step ST6, it is determined whether or not the bit data of the predetermined value is inserted in the predetermined bit of the configuration data Sc. When its insertion is confirmed, an alteration processing of the circuit configuration is executed in step ST4. In the case where it is confirmed that the bit data is not inserted, the circuit configuration alteration processing of step ST4 is skipped, thereby leaving the circuit configuration unaltered.

Thus, because one cannot write configuration data to the integrated circuit 105 unless there is inserted the security bit data in the configuration data Sc, a reverse engineer would first have to analyze this security bit data before s/he analyzes the proprietary information of the integrated circuit 105. Therefore, according to the second embodiment of the present invention, the tamper resistance of the integrated circuit according to the first embodiment of the present invention can be further enhanced. Also, because the security bit data may be inserted after having generated the configuration data for the integrated circuit 105, the specification of the bit data does not influence the generation of the configuration data (including, for example, layout/wiring processes and the like) of the integrated circuit 105, and the efficiency in layout and wiring can be maintained and prevented from being impaired.

<Third Embodiment>

A third embodiment of the present invention will now be described below.

The third embodiment of the present invention relates to a program for a data generation apparatus for generating the configuration data to be supplied to the integrated circuits shown in FIGS. 1 or 8.

Figure 10:
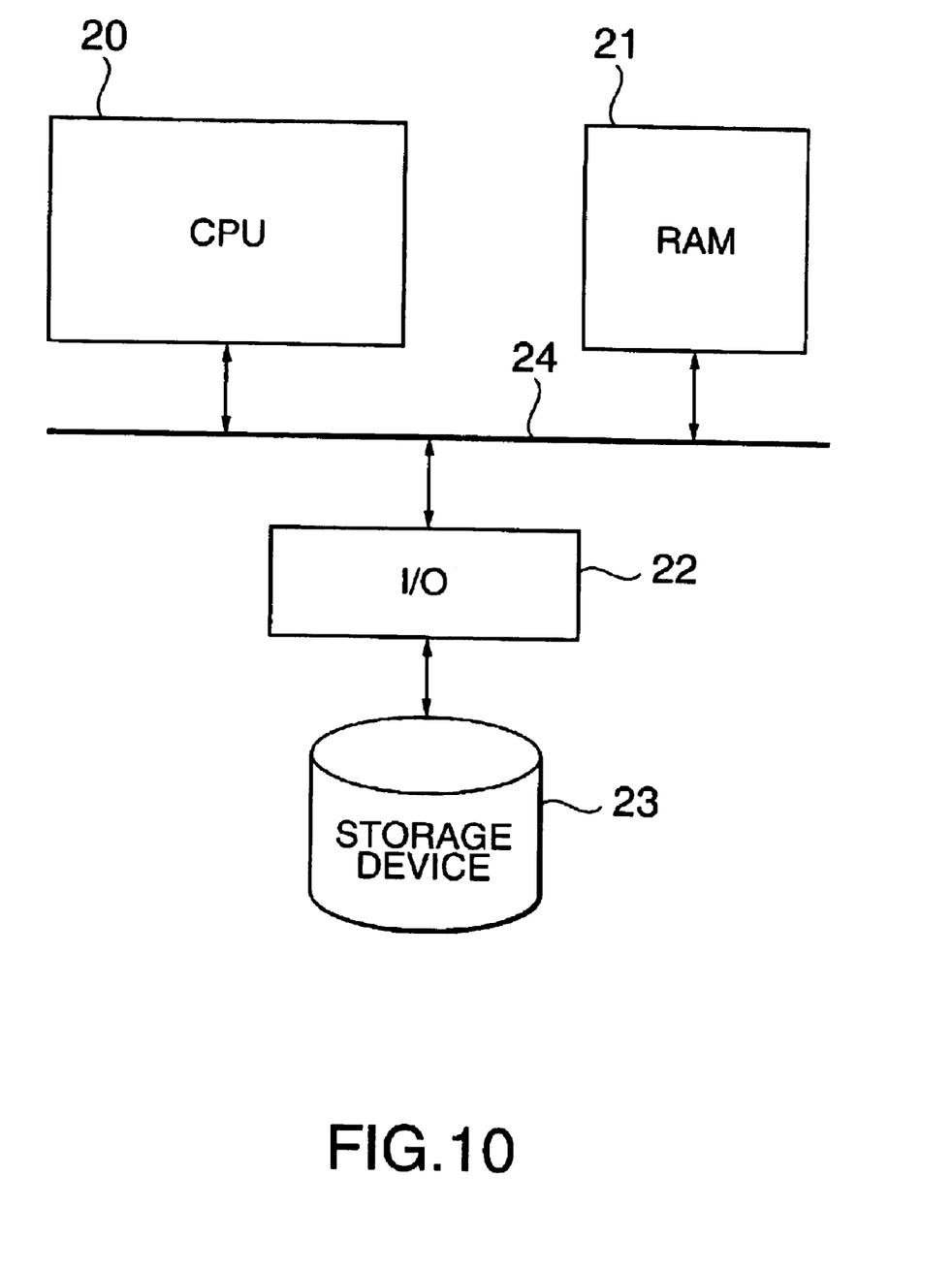
FIG. 10 is a schematic block diagram illustrating an example of a data processing apparatus for generating the configuration data.

FIG. 10 is a schematic block diagram illustrating one example of the data processing apparatuses shown in FIGS. 1 and 8 for generating the configuration data.

In FIG. 10, there are shown a CPU 20, a random access memory (RAM) 21, an input/output section 22, a storage device 23 and a bus 24.

The CPU 20 processes the circuit data stored in the storage device 23 in accordance with a program including the steps shown in FIGS. 6 or 9 stored in the storage device 23, and generates the configuration data.

The RAM 21 provides a memory area for retaining the program for the CPU 20, and/or a memory area to be used temporarily in the processing steps of the CPU 20.

Under the control of the CPU 20, the input/output section 22 reads out data stored at a designated address in the storage device 23, outputs it to the bus 24, and stores the data inputted from the bus 24 at a designated address in the storage device 23. Under the control of the input/output section 22, the storage device 23 reads out the data stored at a designated address therein, outputs it to the input/output section 22, and stores data inputted from the input/output section 22 at a designated address. This storage device 23 stores such data as the program for the CPU 20 containing the steps shown in the flowcharts of FIG. 6 or FIG. 9, the circuit data which becomes the source for generating the configuration data, the configuration data to be supplied to the integrated circuit and the like.

In the data processing apparatus shown in FIG. 10 having the configuration described above, by executing the program including the steps up to the configuration data conversion processing (ST2) in the flowchart of FIG. 6 or the steps up to the security bit insertion processing (ST5) in the flowchart of FIG. 9, it is possible to generate the configuration data to be supplied to the integrated circuit shown in FIG. 1 or FIG. 8, and store it in the storage device 23.

Although, three exemplary embodiments of the present invention have been described above, the present invention is not limited to the exemplary embodiments described above, and various changes, variations, and combinations which should be obvious to those skilled in the art may be made without departing from the scope and spirit of the present invention. For example, although the integrated circuits shown in FIGS. 1 and 8 are illustrated as examples with a configuration commonly found in FPGAs, the present invention is not limited as such, and may also be applied to CPLDs and other various programmable devices. Further, these programmable devices are not limited to logic circuits, and may also include analog circuits whose circuit configuration is alterable in accordance with a configuration data.

What is claimed:

1. An integrated circuit including a plurality of circuit blocks having circuit configurations which are alterable in accordance with a supplied configuration data, the circuit comprising:

a plurality of types of circuit blocks included in said plurality of circuit blocks, wherein said plurality of types of circuit blocks comprises:

a plurality of types of circuit cells for configuring circuits in accordance with said configuration data based on predetermined rules which are mutually different for each of said plurality of types of circuit blocks; and a plurality of types of connection circuits for connecting between said plurality of types of circuit cells in accordance with said configuration data and based on predetermined rules which are different for each type.

2. The integrated circuit according to claim 1, wherein said plurality of types of circuit blocks comprise:

a first type of circuit block which alters the circuit configuration thereof in accordance with said configuration data; and a second type of circuit block which is fixed at a predetermined circuit configuration and for which alteration of the circuit configuration thereof in accordance with said configuration data is not possible.

3. The integrated circuit according to claim 1, wherein said plurality of types of circuit cells comprise:

a first type of circuit cell which alters the circuit configuration thereof in accordance with said configuration data; and a second type of circuit cell having the circuit configuration of said first type of circuit cell with at least a part of the circuit thereof fixed at a predetermined circuit configuration.

4. The integrated circuit according to claim 1, wherein said plurality of types of connection circuits comprise:
  a first type of connection circuit which alters the connection between said circuit cells in accordance with said configuration data; and
  a second type of connection circuit in which at least part of the connections of said first type of connection circuit is fixed at a predetermined connection.

5. The integrated circuit according to claim 1, further comprising a configuration alteration prohibiting circuit for determining whether or not a bit data of a predetermined value is inserted in a predetermined bit in said configuration data, and prohibiting alteration of the circuit configuration of said circuit block depending on a result of said determination.

6. A method of circuit configuration for an integrated circuit having a plurality of circuit blocks with a circuit configuration which is alterable in accordance with a supplied configuration data, comprising the steps of:
  generating said configuration data in accordance with information on a circuit to be configured in said integrated circuit and information on a circuit configuration rule, wherein said configuration data includes first data for specifying a circuit configuration of a first type of circuit block having an alterable circuit configuration, and second data for specifying a connection between a second type of circuit block having a fixed circuit configuration and said first type of circuit block;
  converting said configuration data thus generated in accordance with said information on said circuit configuration rule which differs for each of a plurality of types of circuit blocks included in said plurality of circuit blocks;
  supplying said configuration data thus converted to said integrated circuit; and
  configuring a circuit in accordance with said configuration data thus supplied in each of said circuit blocks in accordance with said configuration rule corresponding to the respective type of each of said circuit blocks, wherein said first type of circuit block is configured, and said first and second types of circuit blocks are connected in accordance with said configuration data.

7. The method of circuit configuration for said integrated circuit according to claim 6, further comprising the steps of:
  inserting a bit data of a predetermined value in a predetermined bit in said generated configuration data in accordance with predetermined information for lifting the circuit configuration alteration prohibition of said circuit block; and
  determining whether or not said bit data of said predetermined value is inserted in said predetermined bit of said configuration data, and prohibiting alteration of the circuit configuration of said circuit block depending on a result of said determination.

8. A program for a data processing apparatus for generating a configuration data of an integrated circuit having a plurality of circuit blocks with a circuit configuration alterable in accordance with said configuration data to be supplied, comprising the steps of:
  generating said configuration data in accordance with information on a circuit to be configured in said integrated circuit and information on a circuit configuration rule, wherein said configuration data includes first data for specifying a circuit configuration of a first type of circuit block having an alterable circuit configuration, and second data for specifying a connection between a second type of circuit block having a fixed circuit configuration and said first type of circuit block; and
  converting said generated configuration data in accordance with information on a circuit configuration rule which differs for each of a plurality of types of circuit blocks included in said plurality of circuit blocks,
  wherein said configuration data specifies a circuit configuration of a first type of circuit block having an alterable circuit configuration and a connection between a second type of circuit block with a fixed circuit configuration and said first type of circuit block.

9. The program according to claim 8, wherein in said step for converting said circuit configuration data, a bit data of a predetermined value is inserted in a predetermined bit in said configuration data in accordance with predetermined information for prohibiting alteration of the circuit configuration of said circuit block.

* * * * *